(12) United States Patent
Ottertun

(10) Patent No.: US 8,236,189 B2
(45) Date of Patent: Aug. 7, 2012

(54) METHOD FOR ETCHING COPPER AND RECOVERY OF THE SPENT ETCHING SOLUTION

(75) Inventor: Harald Ottertun, Hindås (SE)

(73) Assignee: Sigma Engineering AB, Karlstad (SE)

( * ) Notice: Subject to any disclaimer, the term of this patent is extended or adjusted under 35 U.S.C. 154(b) by 406 days.

(21) Appl. No.: 12/665,960

(22) PCT Filed: Jul. 7, 2008

(86) PCT No.: PCT/SE2008/000431
§ 371 (c)(1),
(2), (4) Date: Dec. 22, 2009

(87) PCT Pub. No.: WO2009/008801
PCT Pub. Date: Jan. 15, 2009

(65) Prior Publication Data
US 2011/0000884 A1     Jan. 6, 2011

(30) Foreign Application Priority Data

Jul. 11, 2007   (SE) ........................ 0701681

(51) Int. Cl.
*C23F 1/18* (2006.01)
*C23F 1/00* (2006.01)
(52) U.S. Cl. .................................... 216/93
(58) Field of Classification Search ........... 216/93
See application file for complete search history.

(56) References Cited

U.S. PATENT DOCUMENTS

| | | | | |
|---|---|---|---|---|
| 3,772,105 A | * | 11/1973 | Shipley | 216/93 |
| 3,784,455 A | * | 1/1974 | Parikh et al. | 216/93 |
| 3,855,141 A | * | 12/1974 | Ruff | 423/23 |
| 3,880,685 A | * | 4/1975 | Rehm et al. | 216/93 |
| 4,051,001 A | * | 9/1977 | Inoue et al. | 216/93 |
| 4,060,447 A | * | 11/1977 | Nelson | 216/93 |
| 4,252,621 A | * | 2/1981 | Reinhardt et al. | 205/581 |
| 4,272,492 A | * | 6/1981 | Jensen | 423/24 |
| 4,378,270 A | * | 3/1983 | Brasch | 216/93 |
| 4,388,276 A | * | 6/1983 | Konstantouros et al. | 422/187 |

(Continued)

FOREIGN PATENT DOCUMENTS

GB       2 048 173       12/1980

(Continued)

*Primary Examiner* — Allan Olsen
(74) *Attorney, Agent, or Firm* — Nixon & Vanderhye P.C.

(57) ABSTRACT

An etching and recovery method is described, wherein articles made of copper are etched with an acid aqueous solution of etching chemicals containing $Cu^{2+}$ for oxidizing $Cu^0$ to $Cu^+$, chloride ions, oxidizing agent which oxidizes $Cu^+$ to $Cu^{2+}$, and pH-adjusting hydrochloric acid. The technical problem to be solved is to make it possible to circulate the etching solution between the etching process and the recovery process during the recovery of used etching solution in such a manner that a closed circuit can be maintained between the processes. This is effected in that a regenerated etching solution containing a lower quantity of $Cu^{2+}$ than the used etching solution is produced and in that the recovery process has an extraction step in which removed etching solution is mixed with an organic extraction solution of a complexing compound with which $Cu^{2+}$ forms a copper complex which can be extracted in the organic extraction solution, after which the two mixed liquids are separated once again in order to obtain an organic extraction solution containing said copper complex, and regenerated etching solution. The method is carried out with an etching solution having a pH above 1.5 and a high copper content.

26 Claims, 2 Drawing Sheets

U.S. PATENT DOCUMENTS

Figure 1:
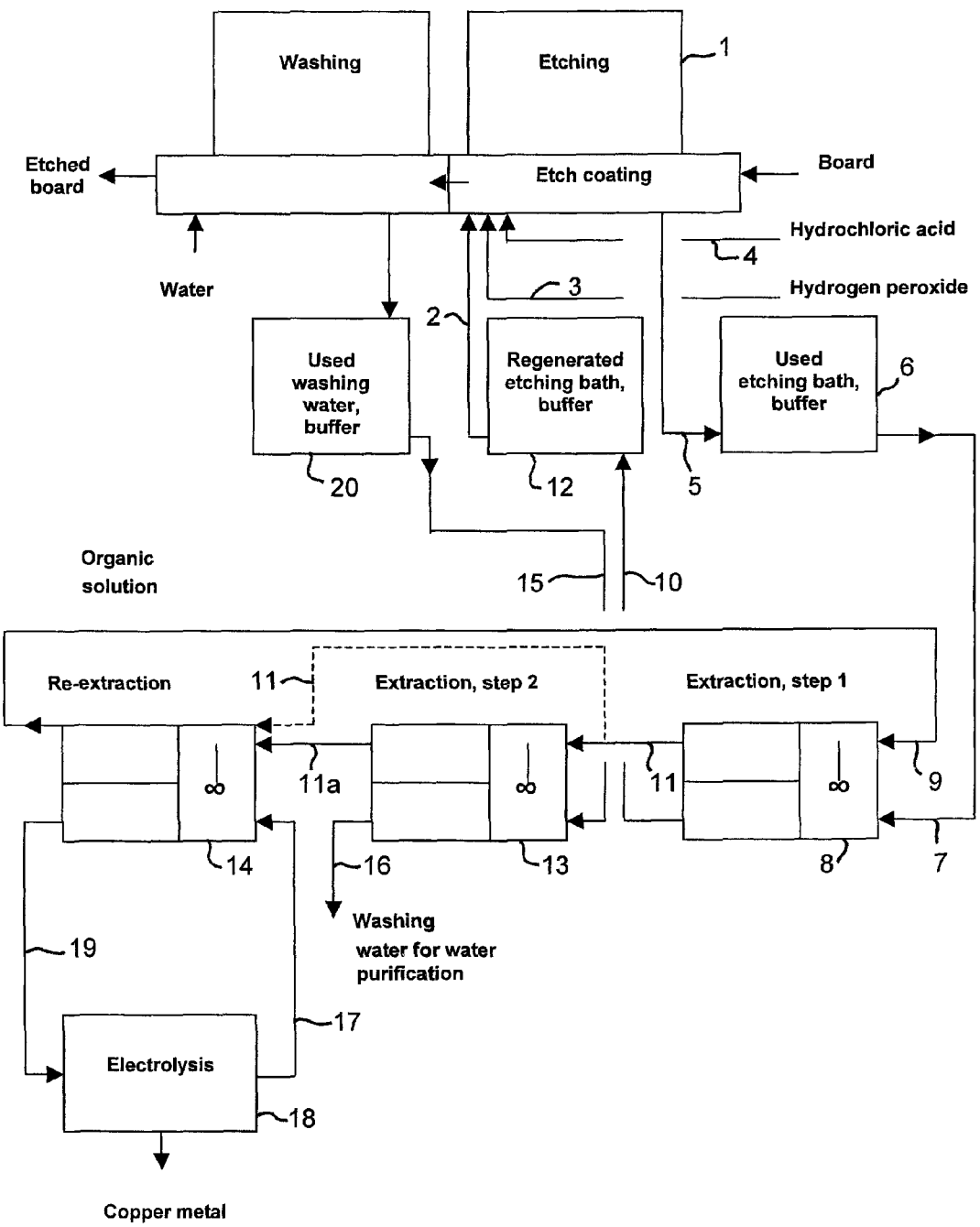

| | | | | |
|---|---|---|---|---|
| 4,545,877 A | * | 10/1985 | Hillis | 216/84 |
| 4,604,175 A | * | 8/1986 | Naumov et al. | 205/750 |
| 4,696,717 A | * | 9/1987 | Bissinger | 216/93 |
| 4,915,776 A | * | 4/1990 | Lee | 216/93 |
| 5,035,765 A | | 7/1991 | Haas | |
| 5,556,553 A | * | 9/1996 | Krulik et al. | 216/93 |
| 5,560,838 A | * | 10/1996 | Allies et al. | 216/93 |
| 5,755,950 A | * | 5/1998 | Bell | 205/445 |
| 6,045,763 A | * | 4/2000 | Kehl et al. | 423/24 |
| 6,086,779 A | * | 7/2000 | Bishop et al. | 216/93 |
| 7,175,819 B2 | | 2/2007 | Zhao et al. | |
| 2011/0056913 A1 | * | 3/2011 | Mayer et al. | 216/84 |

FOREIGN PATENT DOCUMENTS

| | | |
|---|---|---|
| JP | 6-146022 | 5/1994 |
| JP | 11-140673 | 5/1999 |
| SU | 1280045 | 12/1986 |

* cited by examiner

METHOD FOR ETCHING COPPER AND RECOVERY OF THE SPENT ETCHING SOLUTION

This application is the U.S. national phase of International Application No. PCT/SE2008/000431 filed 7 Jul. 2008 which designated the U.S. and claims priority to Swedish Patent Application No. 0701681-9 filed 11 Jul. 2007, the entire contents of each of which are hereby incorporated by reference.

The present invention relates to an etching and recovery method comprising an etching process with at least one etching step in which articles with exposed surfaces of metallic copper are etched with an aqueous, acid etching solution containing etching chemicals, wherein supply of solutions of said etching chemicals during the etching process is accompanied by a removal of an equivalent volume of etching solution, said etching chemicals including divalent copper ions for oxidising metallic copper to monovalent copper ions, chloride ions, an oxidising agent for oxidising said monovalent copper ions to divalent copper ions, hydrochloric acid as a pH-adjusting acid, and an aqueous solution, that contains copper ions, and is added to the working etching solution as required when the copper ion content of the working etching solution exceeds a predetermined interval, the copper ion content of said aqueous solution being below said predetermined interval.

Electronic equipment is nowadays primarily assembled from components soldered on to printed circuit boards. A large quantity of copper is used nowadays in the manufacture of these printed circuit boards. Advanced electronics, e.g. computers, require complicated printed circuit boards and the manufacture of these has led to the growth of a specialised industry. The printed circuit boards are often of the type referred to as the multi-layer type, in which the board may contain several layers, a so-called inner layer and a so-called outer layer on either side thereof. At present, the inner layers are etched primarily with the type of etching solution mentioned hereinabove in the introductory part.

A printed circuit board consists of a base material, often of plastic and a laminate, on which a thin layer of copper has been deposited. A conductive pattern, referred to as a lay-out, consisting of a protective plastic film, referred to as a photoresist, is applied on top of the copper layer. All of the copper not protected by the conductive pattern is then removed during etching.

In conventional etching with acid etching solution, consumed etching solution has to be taken care of, constituting an economic and environmental burden. The said acid etching solution has a very low pH value of 1 or below.

The object of the invention is to eliminate this problem and to provide an etching and recovery method which makes it possible to circulate the etching solution between the etching process and the recovery process in such a manner that a closed circuit is maintained therebetween and in such a manner that etching chemicals can be returned to the etching process.

The etching and recovery method according to the invention is characterised in that
the etching process is carried out with a high copper content, which is within the range of 90 to 260 g copper/l,
the pH of the etching solution is maintained at a value above 1.5, and
the method includes a recovery process integrated with the etching process for receiving and treating said etching solution removed from the etching step in order to obtain a regenerated etching solution containing a reduced quantity of divalent copper ions in relation to the etching solution removed and forming at least a greater part of said aqueous, copper-containing solution that is supplied to the working etching solution in order to restore the divalent copper ion content to a value within said predetermined interval, that is within said range of 90 to 260 g copper/l, said recovery process including a first extraction step in which said etching solution removed is mixed with an organic extraction solution containing a complexing compound with which divalent copper ions form a copper complex, said copper complex being extractable by the organic extraction solution, after which the two mixed liquids are separated from one another once again in order to obtain an organic extraction solution containing said copper complex, and said regenerated etching solution.

It is possible to recover metallic copper of high purity by means of embodiments of the invention. It is furthermore possible to recover the greater part of the copper content of the washing water in metallic form, after which minor residual copper content is removed from the washing water in a conventional water purification plant.

The use of a pH-buffering acid-base pair in the etching solution makes the extraction method advantageous from a technical and economical point of view.

According to one embodiment of the method according to the invention, the regenerated etching solution forms all of said aqueous, copper-containing solution supplied to the working etching solution, i.e. no copper-containing washing water from the process is supplied as such.

According to one embodiment of the method according to the invention, the regenerated etching solution maintains a copper concentration below the copper ion concentration of the used etching solution withdrawn, from 5 to 50 g/l, preferably 15-35 g/l therebelow.

Etching is effected with a solution containing copper chloride and hydrochloric acid of moderate acidity. An oxidising agent is supplied during the etching process in order to maintain a high etching rate. During etching, copper is removed from the surfaces of the printed circuit board where the copper layer is exposed to the etching solution. In order to achieve an even etching rate, the composition of the etching solution is controlled in such a manner that it remains essentially constant during the etching process.

During the etching process, the copper concentration tends to increase as a consequence of the fact that copper metal is released in the etching solution in the form of ions. This causes the density of the etching solution to increase. A density sensor detects the density and controls the addition of a solution, which, in the conventional case without recovery, is a solution without copper or with a relatively low copper content, so that the density and therefore the copper content of the working etching solution remain essentially constant. In said conventional case with an acid etching solution without recovery, the density sensor usually controls the addition of water and/or washing water from subsequent washing steps in the etching line, the washing water containing small quantities of copper. In the method according to the invention, an etching solution regenerated in the recovery process is used instead, said regenerated etching solution having a lower density in that it is stripped of part of its copper content in relation to used etching solution.

During the etching process, metallic copper is released by a reaction with divalent copper ions with the formation of monovalent copper ions according to the following reaction:

The etching rate is in proportion to the divalent copper ion content. In order to maintain a high and essentially constant etching rate, this divalent copper ion content must therefore be maintained at a high and essentially constant level, while the monovalent copper ion content must be maintained at a low level. The monovalent copper ions formed must therefore be oxidised continuously to divalent copper ions in the etching solution with the aid of an oxidising agent. When an aqueous solution of sodium chlorate is used as the oxidising agent, the process follows the following chemical reaction:

$$6Cu^+ + NaClO_3 + 6H^+ \rightarrow 6Cu^{2+} + NaCl + 3H_2O \quad (2)$$

When hydrogen peroxide is used, the reaction proceeds as follows:

$$2Cu^+ + H_2O_2 + 2H^+ \rightarrow 2Cu^{2+} + 2H_2O \quad (3)$$

The addition of oxidising agent is controlled by measuring the redox potential of the etching solution, which is directly related to the ratio between the concentration of divalent and monovalent copper ions in the etching solution. The formation of monovalent copper ions via the etching process tends to reduce the redox potential, while the addition of oxidising agent restores the potential to a preset setpoint value.

The pH value of the etching solution is controlled by the addition of concentrated hydrochloric acid, preferably having a normal commercially available concentration of 37%. This therefore compensates for the moderate loss of chloride ions from a closed etching and recovery system according to the invention, as a result of what is referred to as the "drag-out" of etching solution on etched printed circuit boards and via the ventilation of the etching machine equipment.

When sodium chlorate is used as the oxidising agent, a certain amount of the used etching solution must also be withdrawn from the closed etching system for reasons of material balance in order to counteract an accumulation of sodium chloride, this salt being formed according to reaction (2) hereinabove. This etching solution volume is intermixed with the washing water from the etching process for treatment in the extraction process so that the copper content of the resulting copper-enriched washing water can be recovered.

In the conventional etching method without recovery, hydrochloric acid is consumed in a quantity of approximately 2.6 liters per kilo of etched copper. When sodium chlorate is used as the oxidising agent in the method according to the invention, the consumption of hydrochloric acid is reduced to approximately 30% of this quantity, i.e. to 0.8 liters per kilo of etched copper. When hydrogen peroxide is used as the oxidising agent, the consumption is reduced to about 5% of this quantity, corresponding to 0.2 liters per kilo of etched copper.

The consumption of hydrochloric acid in the conventional case is directly proportional to the etched quantity of copper described by reactions (2) and (3). This reaction shows how hydrogen ions are consumed with the formation of water and divalent copper ions. These hydrogen ions are constantly replenished by feeding in hydrochloric acid. In the case of recovery according to the invention, these hydrogen ions are reformed by the ion exchange in the extraction process, in which a divalent copper ion is exchanged for two hydrogen ions. However, this does not take place up to 100%, since a small quantity of the etching solution leaves the closed etching solution circuit as extracts on the printed circuit boards leaving the etching machine, as mist via the ventilation of the etching machine and, if sodium chlorate is used as the oxidising agent, as a controlled extract supplied to the washing water of the etching process. These extracts contain on average a copper quantity corresponding to 5 to 30% of the quantity of copper that is etched. A quantity of acid corresponding to this quantity of copper must therefore still be supplied in order to maintain a suitable pH value for the etching solution. This would otherwise tend to increase.

The chloride ion content of the etching solution is not changed in the extraction process, as this only involves an exchange of copper ions for hydrogen ions.

During continuous operation in the closed etching solution circuit, the chloride ion content of the etching solution depends on the balance between, on the one hand, the quantity of water in solutions supplied (concentrated hydrochloric acid and sodium chlorate solution or hydrogen peroxide solution) plus "chemically formed water" via reaction (2) or (3) and, on the other hand, the quantity of water extracted via the ventilation of the etching machine and by the extract of etching solution on etched printed circuit boards and etching solution withdrawn if sodium chlorate is used as the oxidising agent.

Should the water balance gradually lead to re-concentration of the etching solution with an increasing chloride content, water, e.g. washing water, may be supplied to the etching solution or, in exceptional cases, further diluted feed solution, e.g. hydrochloric acid, may be used.

Conversely, with a decreasing chloride content, measures for increasing the evaporation of water from the etching solution may be considered. In the case of a possibly increasing total etching solution volume in the circuit over time, etching solution can be withdrawn from the circuit and fed to the treatment step for washing water as discussed hereinabove.

The following equilibrium reaction is produced in the extraction step according to the invention:

$$Cu^{2+}_{(aq)} + 2HA_{(org)} \rightleftharpoons 2H^+_{(aq)} + CuA_{2(org)} \quad (4)$$

where HA is a complexing compound.

The course of reaction can thus proceed in both directions. When the rates in both directions are the same, equilibrium has been achieved and the content of incoming components remains constant. The production of this equilibrium depends on the contents of the respective ion types in the aqueous solution and on the contents of the free complexing agent HA or the copper complex $CuA_2$ in the organic solution. The equilibrium is produced in such a manner that the following equation is satisfied:

$$[H^+]_{(aq)}^2 \cdot [CuA_2]_{(org)} / [Cu^{2+}]_{(aq)} \cdot [HA]_{(org)}^2 = K \quad (5)$$

where K designates an equilibrium constant and other factors the concentrations of the substances taking part in the equilibrium above.

When copper is extracted and the process proceeds towards the right in the equilibrium reaction (4) described hereinabove, the hydrogen ion content in the aqueous solution also increases, i.e. its pH value is lowered. It can be said that ion exchange takes place during the extraction process, with a divalent copper ion being exchanged for two monovalent copper ions. It is furthermore true that an initially high copper content in the aqueous solution promotes a reaction proceeding towards the right, i.e. the concentration factor $[CuA_2]_{(org)}$ increases. In the same manner, a reaction proceeding in this direction would be promoted if the corresponding hydrogen ions formed could be bound by another known reaction process taking place simultaneously so as to counteract the increase in the hydrogen ion content.

This is effected according to one embodiment of the invention in that the working etching solution contains a predetermined concentration of a pH-buffering acid-base pair. An acid-base pair having its maximum buffering effect just below the pH value at which the etching method is carried out is preferably selected.

A suitable example of an acid-base pair of this kind is $HSO_4^-/SO_4^{2-}$. This acid-base pair gives a maximum buffering effect at a pH of approximately 1.9, which is advantageous in this case when the etching solution withdrawn from the etching process initially maintains a pH value of 2.0 to 3.0. The base form $SO_4^{2-}$ dominates in this pH range. During the extraction process, the sulphate ions act as what is referred to as a pH buffer by binding the hydrogen ions released during the extraction process according to reaction (4) hereinabove by the following reaction referred to as a protolysis reaction:

$$SO_4^{2-} + H^+ \rightarrow HSO_4^- \tag{6}$$

Sulphate is added to the working etching solution upon start-up, preferably to a concentration of up to 100 g/l. Up to that level, there is no noticeable effect on etching functionality.

The extraction yield of the process in the form of "delta copper", defined as the difference in the copper content between that present in the etching solution withdrawn, which is added in the extraction step, and that present in the etching solution after the extraction step, can be increased considerably by the addition of sulphate. This has a considerable effect on the cost-effectiveness of the process, as the capacity of the plant can be increased to a corresponding extent.

The copper extracted to the organic solution is re-extracted in the re-extraction step to a sulphuric acid solution, wherein this process can be described by the following equilibrium reaction:

$$CuA_{2(org)} + 2H^+_{(aq)} \rightleftharpoons 2HA_{(org)} + Cu^{2+}_{(aq)} \tag{7}$$

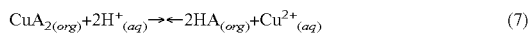

This is precisely the same equilibrium described hereinabove for the above extraction process, reaction (4), with the formal difference that the direction of the reaction is reversed. This method for writing the equilibrium has been selected in order to indicate that the ion exchange reaction is carried out towards the right, i.e. that copper leaves the organic solution in a highly acidic environment and is transferred to the aqueous solution. It therefore remains the case that the hydrogen ion concentration is maintained at a high level, with the result that the copper complex in the organic solution is split and released copper ions are returned to the aqueous solution in exchange for twice the quantity of hydrogen ions.

The copper is recovered from the sulphuric acid solution, preferably by electrolysis. The corresponding course of the reaction can be written as follows:

$$Cu^{2+}_{(aq)} + H_2O_{(aq)} \rightarrow Cu^0_{(solid\ phase)} + 2H^+_{(aq)} + \tfrac{1}{2}O_{2(gas)} \tag{8}$$

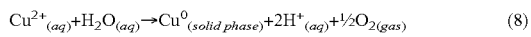

The recovery of copper from the sulphuric acid solution can alternatively be carried out via the crystallisation of copper sulphate.

Figure 2:
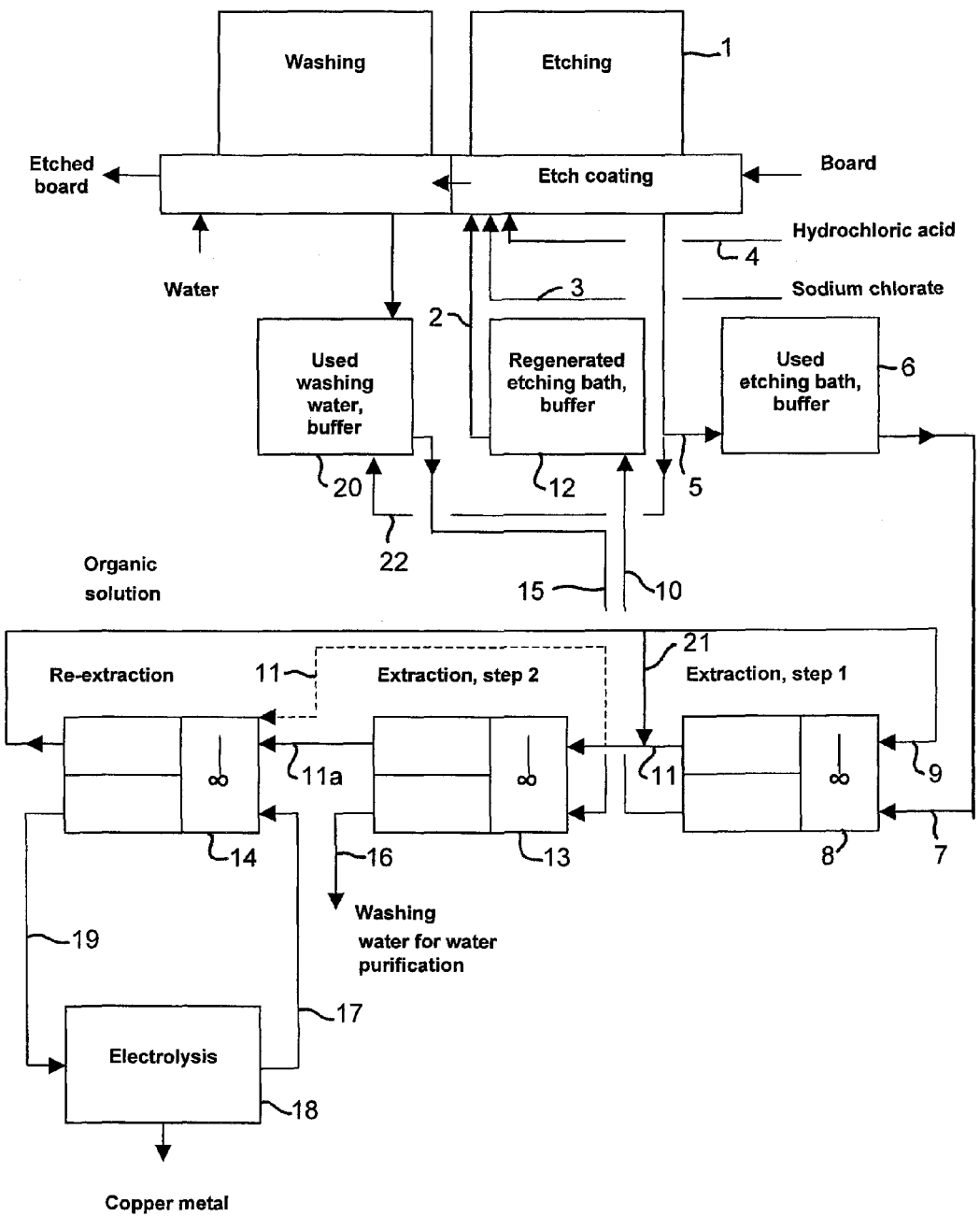

The invention will now be described in more detail with reference to FIG. 1, showing a flow diagram when hydrogen peroxide is used as the oxidising agent, and to FIG. 2, showing a flow diagram when sodium chlorate is used as the oxidising agent.

Etching is carried out in that the etching solution is sprayed on to the printed circuit boards in a shielded chamber 1 at a temperature of 45-50° C. The working etching solution contains as one of the main components copper ions, predominantly in the divalent state. The total copper ion content is present in a quantity of a predetermined value within a predetermined range. The predetermined range can be very narrow on both sides of the predetermined value, such as ±0.5 g/l. In the practical embodiment of the etching process, the predetermined range is advantageously ±5 g/l in relation to a predetermined value of divalent copper ions. The predetermined value is selected within a broad range of 90-260 g copper/l. A preferred broad range is 130 to 225 g copper/l. It will be clear that the majority of the copper ions present in the working etching solution are composed of divalent copper ions and that the proportion of monovalent copper ions in the practical embodiment can therefore be regarded as negligible. The etching solution contains as another main component chloride ions in a quantity of a predetermined value selected within a broad range of 100-350 g/l, within a predetermined range, advantageously ±10 g/l.

With respect to the composition of the etching solution, it should first be noted that etching is normally carried out as a continuous process in order to maintain uniform quality and high productivity. This means that several solutions are added intermittently at a certain flow rate to the working etching solution in the etching machine in order to maintain as constant a chemical composition thereof as possible as copper is etched. As soon as solutions are supplied, there is an excess volume of etching solution in the etching machine, this being drawn off as "used" or "removed" etching solution and conveyed to a corresponding buffer tank for subsequent regeneration by the extraction of a part of the copper content.

Monovalent copper ions are formed continuously during the etching process. In order to ensure that there is no negative effect on the etching rate as a result of an increased concentration of the monovalent copper ions, oxidising agent is supplied intermittently. This metered supply is controlled by measuring the redox potential of the etching solution, by means of a platinum electrode with a calomel electrode as a reference electrode. The redox potential is lowered as the monovalent copper ion content increases and is increased by the metered supply of the oxidising agent. The setpoint value for the redox potential as measured by the specified method is set at +750 mV in conventional etching without recovery. The same value can be used in the method according to the invention, but it is advantageous for the subsequent recovery process to use a higher value, allowing the etching to be carried out at a higher pH value, advantageous for the extraction yield in the recovery process.

The pH value of the etching solution is an important parameter for the etching process. This will be clear from the course of the reaction, in which monovalent copper ions are oxidised to divalent copper ions by the reactions specified hereinabove:

$$6Cu^+ + NaClO_3 + 6H^+ \rightarrow 6Cu^{2+} + NaCl + 3H_2O \tag{2}$$

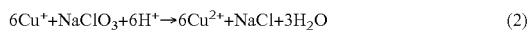

$$2Cu^+ + H_2O_2 + 2H^+ \rightarrow 2Cu^{2+} + 2H_2O \tag{3}$$

In accordance with the law of mass action, the oxidation process, and therefore the etching rate, is promoted by an increased hydrogen ion content, i.e. a lower pH value. On the other hand, an excessively acidic pH value has an adverse effect on the extraction yield in the recovery process. An optimum pH value is in the range of 2.0 to 3.0.

The principle of the embodiment of the etching and recovery processes according to the invention can be described as follows with reference to the accompanying figures.

During the etching process, the following solutions are supplied intermittently in order to maintain a constant composition of the etching chemicals in the etching solution sprayed on to the printed circuit boards in the shielded chamber 1.

Regenerated etching solution 2 from the recovery process with a lower copper content than that present in the etching solution working in the etching machine in order to maintain a copper concentration within a predetermined range.

Oxidising agent solution in order to maintain a high divalent copper ion content and a low monovalent copper ion content.

Hydrochloric acid 4, 37% aqueous solution in order to maintain a constant pH value.

The excess volume of etching solution occurring is removed from the etching machine, e.g. by overflowing, when any one of the three solutions mentioned hereinabove are fed into the etching system. The used etching solution 5 is transported to a buffer tank 6 for temporary storage so that it is possible for the etching process to be carried out independently of the operation of the recovery process. The used etching solution maintains the same copper content as that present in the etching solution working in the etching machine.

Used etching solution 7 from the buffer tank 6 is fed to the first extraction step 8, where it is mixed with an organic extraction solution 9 containing a reagent having the capacity to form a complex with copper, wherein the copper complex can be extracted to the organic extraction solution 9. An organic extraction reagent with suitable physicochemical properties for a liquid-liquid extraction process according to the invention and with the capacity to extract divalent copper ions from a relatively acid aqueous solution is used as a complexing agent.

An ion exchange takes place during the first extraction step 8 so that divalent copper ions leave the etching solution and simultaneously the etching solution receives the hydrogen ions from the organic extraction solution. The chloride ion and sulphate ion content of the etching solution remains practically unchanged.

The two combined liquid phases are separated from one another in order to obtain a regenerated etching solution 10 and an organic, copper complex-containing solution 11. The regenerated etching solution 10 after the first extraction step has a copper concentration below that of the used etching solution 5, 7 at 15 to 50 g/l, referred to hereinabove as "delta copper". The regenerated etching solution 10 is transported to a corresponding buffer tank 12 in order to be returned to the etching system as required.

The organic copper complex-containing solution 11 having a copper content of the order of 7 to 15 g/l is further fed according to a first embodiment to a second extraction step 13 or according to another embodiment directly to a re-extraction step 14 described in more detail hereinafter. Used washing water 15 from the etching process is fed to the second extraction step 13 in order to bring it into contact with the organic solution 11 from the first step. The organic solution 11 can then be washed free of remaining small quantities of etching solution which may have been entrained from the first extraction step 8. If the washing water has an initially sufficiently low copper content, it can be stripped practically completely of its copper content.

When required, the second extraction step can moreover be fed the same organic solution fed to the first extraction step. The additional feeding of organic solution to the second step of this kind is used when the copper content of the washing water is high as a result of the high extraction of etching solution in the etching process or as a result of the fact that a certain amount of the etching solution in the closed etching cycle is supplied intentionally to the used washing water after the etching process.

When required, caustic soda solution can be supplied to the second extraction step in order to increase the pH value of the outgoing washing water and thus increase the extraction yield for copper.

The two combined liquid phases, which have different densities and cannot be mixed together, are separated from one another in order to obtain an aqueous solution 16 dissolving said etching solution residues, and the organic, copper complex-containing solution 11a. The aqueous solution 16 is advanced to an available purification plant for further treatment. The organic solution 11a is advanced to the re-extraction step 14, where it is brought into contact with a sulphuric acid solution 17. This maintains a free sulphuric acid concentration within the range of 150 to 220 g/l. The sulphuric acid solution 17 is fed from an electrolysis unit 18. The copper content thereof is preferably within the range of 25 to 30 g/l.

The two combined liquid phases are separated from one another in order to obtain a re-extraction solution in the form of a sulphuric acid solution 19 enriched with copper and a recovered organic solution 9 with a low copper content. The sulphuric acid solution 19 is returned to the electrolysis unit 18. The copper-enriched sulphuric acid solution 19 has a copper concentration in the range of 30 to 40 g/l. The organic solution 9 with a low copper content is returned to a storage tank (not shown), from where it is fed back to the first extraction step 8 for renewed extraction.

The mixing and separation of organic solution and aqueous solution in the various extraction steps is carried out either in conventional devices referred to as mixer-settlers or in more advanced devices referred to as extractors, in which the liquid phases are separated with the aid of centrifuges.

EXAMPLES

The etching process integrated with the recovery process according to the flow diagram in FIG. 1 has been tested industrially, with hydrogen peroxide being used as the oxidising agent. The result of the experiment is illustrated by the following example. The used etching solution 7 removed from the etching step had the following composition:

| | |
|---|---|
| $Cu^{2+}$ | 118 g/l |
| $Cl^-$ | 132 g/l |
| $SO_4^{2-}$ | 50 g/l |
| pH | 2.2 |

The etching solution 7 was pumped from the buffer tank 6 to a mixer-settler plant with a first extraction step 8, a second extraction step 13 and a re-extraction step 14. The flow rate of the etching solution was 0.4 l/min.

In the first extraction step 8, the used etching solution 7 was brought into contact with an organic solution 9 containing 30 percent by volume of a hydroxyoxime, 65 percent by volume of a solvent containing an essentially aliphatic hydrocarbon and 5 percent by volume of a solvent containing aromatic hydrocarbons. The flow rate of the organic solution was 1.2 l/min. At this point, copper was extracted from the etching solution so that the copper content fell to 93 g/l, i.e. a reduction of 25 g/l. The raffinate 10 was then pumped to the buffer tank 12 for regenerated etching solution.

The organic solution 11 containing 9 copper was brought into contact with washing water 15 from a buffer tank 20 in the second extraction step 13. The washing water had the following composition:

| | |
|---|---|
| $Cu^{2+}$ | 0.59 g/l |
| $Cl^-$ | 0.66 g/l |

| | |
|---|---|
| $SO_4^{2-}$ | 0.25 g/l |
| $H_2O$ | remainder |

The flow rate was 0.4 l/min. The copper content of the outgoing washing water 16 was measured to be 0.10 g/l. The washing solution 16 was then fed to an available purification plant.

The organic solution 11a was conveyed to the re-extraction step 14, where it was brought into contact with a sulphuric acid solution 17 containing 25 g/l copper and 160 g/l free sulphuric acid. The flow rate of acid solution was 1.2 l/min. At this point, the copper was re-extracted to the sulphuric acid solution. Outgoing re-extraction solution 19 contained 33 g/l copper.

The organic solution 9 from the re-extraction 14 contained 1.0 g/l copper. It was circulated for renewed extraction of copper.

The outgoing, copper-enriched sulphuric acid solution 19 was returned to the electrolysis unit 18, where it was intermixed with a large volume of circulating sulphuric acid solution 17 in order to dilute the copper content to the level of 25 g/l, present in this circulating solution 17. The electrolysis unit 18 was operated according to known technology with a cell voltage of 2.0 V and a current density of 1.5 A/dm².

Hydrogen sulphate/sulphate, the acid form of which has a $pK_a$ value of 1.9, was selected as the acid-base pair in that it is technically advantageous to use and is simultaneously available at low cost. Examples of other suitable acid-base pairs are those wherein the acid form has a $pK_a$ value within the range of 1.5-2.5, easily found in chemical tables by the person skilled in the art.

With respect to the acid-base pair, it is added to the etching solution and is not extracted, but remains in the closed etching solution circuit. Only selective exchange of copper ions for hydrogen ions takes place in the extraction process. A small quantity of the etching chemicals is of course ultimately lost as a result of the etch coating in the etching machine. Make-up acid-base pair is therefore added after a relatively long period of time by the addition of a moderate quantity of a concentrate thereof. In this case shown by way of example with sulphate-hydrogen sulphate as the acid-base pair, concentrated sulphuric acid is advantageously used in order to adjust the sulphate content of the etching solution upwards. The sulphuric acid can be added in a mixture with the concentrated hydrochloric acid solution supplied to the etching solution during the etching process via the pH control.

The etching process integrated with the recovery process according to the flow diagram in FIG. 2 has also been tested industrially for an etching solution in which sodium chlorate is used as the oxidising agent. In this case, etching can be carried out with a very high copper content. The result of the experiment is illustrated by the following example. The used etching solution 7 emanating from the etching step had the following composition:

| | |
|---|---|
| $Cu^{2+}$ | 210 g/l |
| $Cl^-$ | 340 g/l |
| pH | 2.0 |

The etching solution 7 was pumped from the buffer tank 6 to a mixer-settler plant with a first extraction step 8, a second extraction step 13 and a re-extraction step 14. The flow rate of the etching solution was 0.4 l/min.

In the first extraction step 8, the used etching solution 7 was brought into contact with an organic solution 9 containing 35 percent by volume of a hydroxyoxime, 60 percent by volume of a solvent containing an essentially aliphatic hydrocarbon and 5 percent by volume of a solvent containing aromatic hydrocarbons. The flow rate of the organic solution was 1.1 l/min. The incoming organic solution had a low copper content as it was previously subjected to a re-extraction step 14 wherein its copper content was essentially removed. At this point, copper was extracted from the etching solution in this extraction step 8 so that the copper content fell to 185 g/l, i.e. a reduction of 25 g/l. The raffinate 10 was then pumped to the buffer tank 12 for regenerated etching solution.

The organic solution 11, which now contained 10 g/l copper, was brought into contact in the next step with washing water 15 from a buffer tank 20 in the second extraction step 13. A part flow 21 of the same organic solution with a low copper content fed to the first step 8 was also fed to this same step 13. This flow rate was 0.7 l/min. The total flow rate of organic solution to step 13 was therefore 1.8 l/min. The washing water had the following composition:

| | |
|---|---|
| $Cu^{2+}$ | 7.0 g/l |
| $Cl^-$ | 11.0 g/l |
| $H_2O$ | remainder |

This washing water has a comparatively high copper concentration, related to the fact that a certain portion of used etching solution is supplied to the washing water system. This portion is adapted so as to maintain the sodium ion concentration in the etching solution circuit at a moderately high level. This level is approximately 3 mol/l or approximately 70 g/l.

The washing water flow rate was 1.1 l/min. The copper content of the outgoing washing water 16 was measured to be 0.10 g/l. The washing solution 16 was then fed to an available purification plant.

The organic solution 11a having a copper content of 10 g/l was conveyed to the re-extraction step 14, where it was brought into contact with a sulphuric acid solution 17 containing 25 g/l copper and 160 g/l free sulphuric acid. The acid solution flow rate was 2.9 l/min. At this point, the copper was re-extracted to the sulphuric acid solution. Outgoing re-extraction solution 19 contained 30 g/l copper.

The organic solution 9 from the re-extraction 14 contained 2.0 g/l copper. It was circulated for renewed extraction of copper.

The outgoing, copper-enriched sulphuric acid solution 19 was returned to the electrolysis unit 18, where it was intermixed with a large volume of circulating sulphuric acid solution in order to dilute the copper content to the level of 25 g/l present in this circulating solution 17.

The electrolysis unit 18 was operated according to known technology with a cell voltage of 2.0 V and a current density of 1.5 A/dm².

In particular, the treatment of baths from the etching of what are referred to as printed circuit boards has been described. However, it will be clear that the invention may also be applied to the recovery of baths from the etching of other articles made of copper in addition to printed circuit boards.

The most important criterion for usable complexing agents is that they are sufficiently strong in the sense that they can form extractable complexes with divalent copper ions even in a relatively acidic aqueous solution like the present etching solution. In addition to the group of hydroxyoximes forming extraction reagents, other possible groups that can be mentioned here are beta-diketones, tropolones, 8-hydroxyquinolines, also referred to as oxines, and alkylated cupferrons.

The addition of acid solution and oxidising agent solution can of course be controlled in a different manner from that described hereinabove. It is possible, for instance, to use a control principle using light absorption related to the turbidity of the etching solution and using the measuring signal so as to feed in alternately either acid solution or oxidising agent solution. The result is checked for each addition, i.e. whether the etching solution becomes clear or not. If the etching solution becomes clear, the metered addition is stopped. When the etching solution becomes turbid once again, the second of the two said solutions is added, the alternating metering continuing in this manner.

It is of course possible to use other oxidising agents than those described above in more detail, such as ozone or chlorine gas, for instance.

The invention claimed is:

1. An etching and recovery method comprising an etching process and a recovery process, said etching process comprising at least one etching step in which articles with exposed surfaces of metallic copper are etched with an aqueous, acid etching solution containing etching chemicals, wherein supply of solutions of said etching chemicals during the etching process is accompanied by a removal of an equivalent volume of etching solution, said etching chemicals including divalent copper ions for oxidizing metallic copper to monovalent copper ions, chloride ions, an oxidizing agent for oxidizing said monovalent copper ions to divalent copper ions so that there is no negative effect on the etching rate as a result of an increased concentration of monovalent copper ions, hydrochloric acid as a pH adjusting acid, and an aqueous solution, that contains divalent copper ions, and is added to the working etching solution as required when the divalent copper ion content of the working etching solution exceeds a predetermined interval, the divalent copper ion content of said aqueous solution being below said predetermined interval, characterized in that the etching process is carried out with a high copper content, which is within the range of 90 to 260 g copper/l, and with a chloride content within the range of 100-350 g Cl-/l, the pH of the etching solution is maintained at a value above 1.5, and said recovery process is integrated with the etching process for receiving and treating said etching solution removed from the etching step in order to obtain a regenerated etching solution containing a reduced quantity of divalent copper ions in relation to the etching solution removed and forming at least a greater part of said aqueous solution that contains divalent copper ions and is supplied to the working etching solution in order to restore the divalent copper ion content to a value within said predetermined interval, that is within said range of 90 to 260 g copper/l, said recovery process including a first extraction step in which said etching solution removed is mixed with an organic extraction solution containing a complexing compound with which divalent copper ions form a copper complex, said copper complex being extractable by the organic extraction solution, after which the two mixed liquids are separated from one another once again in order to obtain an organic extraction solution containing said copper complex, and said regenerated etching solution.

2. The etching and recovery method according to claim 1, characterized in that the etching process is carried out with a high copper content that is within the range of 130 to 225 g copper/l.

3. The etching and recovery method according to claim 1, characterized in that the working etching solution has a pH value within the range of 2.0-3.0.

4. The etching and recovery method according to claim 1, characterized in that the regenerated etching solution forms all of said aqueous, copper-containing solution supplied to the working etching solution.

5. The etching and recovery method according to claim 1, characterized in that said oxidizing agent is added to the etching process as required in order to replace oxidizing agent consumed in the etching step.

6. The etching and recovery method according to claim 1, characterized in that the oxidizing agent is sodium chlorate or hydrogen peroxide.

7. The etching and recovery method according to claim 1, characterized in that the addition of oxidizing agent is controlled by measuring the redox potential of the etching solution.

8. The etching and recovery method according to claim 1, characterized in that the complexing compound is a hydroxyoxime.

9. The etching and recovery method according to claim 1, characterized in that a predetermined portion of used etching solution is supplied to the washing water that has been used for washing the etched articles.

10. The etching and recovery method according to claim 1, characterized in that the regenerated etching solution has a copper concentration below the copper ion concentration of the used and withdrawn etching solution from 5 to 50 g/l.

11. The etching and recovery method according to claim 10, characterized in that the regenerated etching solution has a copper concentration below the copper ion concentration of the used and withdrawn etching solution from 15-35 g/L.

12. The etching and recovery method according to claim 1, characterized in that the etching and recovery method is carried out in the presence of a pH-buffering acid-base pair having the capacity to bind hydrogen ions released during the recovery process, the acid form of the acid-base pair having a pKa value within the range of 1.5-2.5.

13. The etching and recovery method according to claim 12, characterized in that the acid-base pair has a maximum buffering effect at a pH value below the selected pH value of the working etching solution.

14. The etching and recovery method according to claim 12, characterized in that acid-base pair is included in a quantity which will not have a detrimental effect on the etching.

15. The etching and recovery method according to claim 12, characterized in that the base form of the acid-base pair is present in a quantity of 100 g/l.

16. The etching and recovery method according to claim 12, characterized in that the acid-base pair is $HSO_4^-/SO_4^{2-}$.

17. The etching and recovery method according to claim 16, characterized in that the sulphate content of the etching solution is adjusted by the addition of concentrated sulphuric acid.

18. The etching and recovery method according to claim 1, characterized in that a density sensor detects the density of the working etching solution and controls the addition of regenerated etching solution having a lower copper content and thus a lower density in relation to the etching solution removed.

19. The etching and recovery method according to claim 18, characterized in that the recovery process includes a re-extraction step in which the extraction solution containing the organic copper complex obtained in the first extraction step is brought into contact with a sulphuric acid solution in order to split the copper complex in order to obtain released divalent copper ions and a regenerated organic extraction solution containing the complexing compound and is returned to the first extraction step.

20. The etching and recovery method according to claim 19, characterized in that the recovery process includes a step for recovering metallic copper from the sulphuric acid solution obtained in the re-extraction step.

21. The etching and recovery method according to claim 20, characterized in that the copper is recovered by electrolysis or by the crystallization of copper sulphate.

22. The etching and recovery method according to claim 1, wherein the etching process includes a washing step for washing the etched articles with water, characterized in that the recovery process also includes a second extraction step which is carried out before or after the first extraction step, and in which used washing water containing small quantities of divalent copper ions is mixed with an organic extraction solution containing a complexing compound with which divalent copper ions present in said washing water form a copper complex, said copper complex being extractable in the organic extraction solution, after which the two mixed liquids are separated from one another once again in order to obtain an organic extraction solution which contains said copper complex and is fed to the first extraction step or to the re-extraction step, and washing water which is fed away for water purification.

23. The etching and recovery method according to claim 22, characterized in that a part flow of said regenerated organic extraction solution, which is returned to the first extraction step, is fed to said second extraction step for washing water.

24. The etching and recovery method according to claim 23, characterized in that the second extraction step is carried out after the first extraction step, whereby the organic extraction solution leaving the first extraction step being fed to the second extraction step in order to be mixed with said washing water washing out etching solution residues present in said extraction solution from the first extraction step, whereby the organic extraction solution leaving the second extraction step being fed to the re extraction step.

25. The etching and recovery method according to claim 23, characterized in that the second extraction step is carried out before the first extraction step, whereby the organic extraction solution recovered in the re-extraction step or parts thereof being supplied as the organic extraction solution, and in that the organic solution containing said copper complex and leaving the second extraction step is fed to the first extraction step in order to be mixed with used etching solution.

26. The etching and recovery method according to claim 25, characterized in that a part of the recovered organic extraction solution is supplied to the first extraction step.

* * * * *